United States Patent [19]

Kasprzyk

[11] 4,394,708
[45] Jul. 19, 1983

[54] ELECTRONIC THERMOSTAT WITH PROTECTED CIRCUITRY

[75] Inventor: Donald J. Kasprzyk, Maple Grove, Minn.

[73] Assignee: Honeywell Inc., Minneapolis, Minn.

[21] Appl. No.: 261,067

[22] Filed: May 6, 1981

[51] Int. Cl.³ .............................................. H05K 5/02
[52] U.S. Cl. .................................. 361/399; 361/395; 337/414
[58] Field of Search .............................. 361/380–383, 361/395, 399, 428; 174/16 R, 52 R; 337/380, 414; 200/293, 303, 306

[56] References Cited

U.S. PATENT DOCUMENTS

| 3,131,330 | 4/1964 | Allen | 361/390 |
| 3,727,110 | 4/1973 | Sopko, Jr. | 361/331 |
| 3,808,504 | 4/1974 | Rubie | 361/340 |
| 4,218,724 | 8/1980 | Kaufman | 361/399 |
| 4,235,368 | 11/1980 | Neel | |
| 4,295,180 | 10/1981 | Herron | 361/399 |
| 4,310,870 | 1/1982 | Kia | 361/399 |
| 4,336,569 | 6/1982 | Tsuda | 361/399 |

Primary Examiner—G. P. Tolin
Attorney, Agent, or Firm—Alfred N. Feldman

[57] ABSTRACT

An electronic thermostat is provided with a mounting arrangement between the base means and the cover means that fully protects the electronic components within from both physical and electrical damage during the normal handling of the thermostat. The protection is accomplished by recessing the contact points for the circuitry within openings that can be reached only by mating electrical contacts.

8 Claims, 5 Drawing Figures

U.S. Patent  Jul. 19, 1983  4,394,708
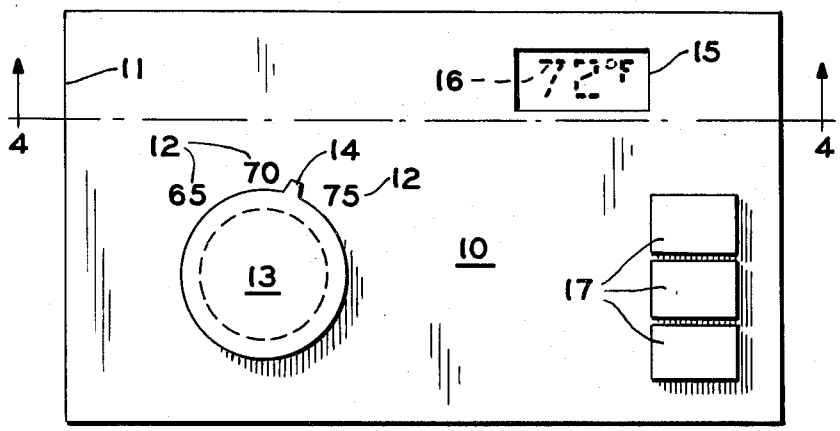
FIG. 1
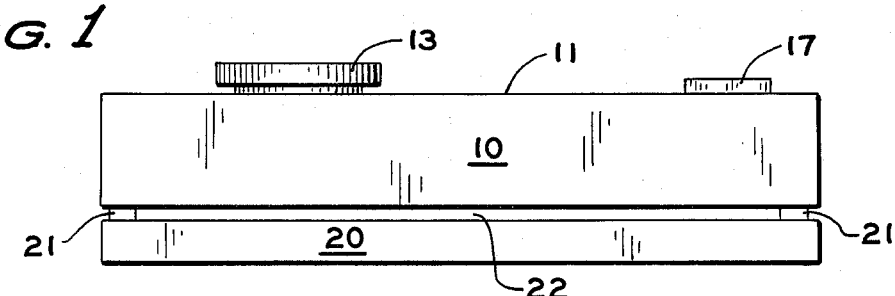
FIG. 2
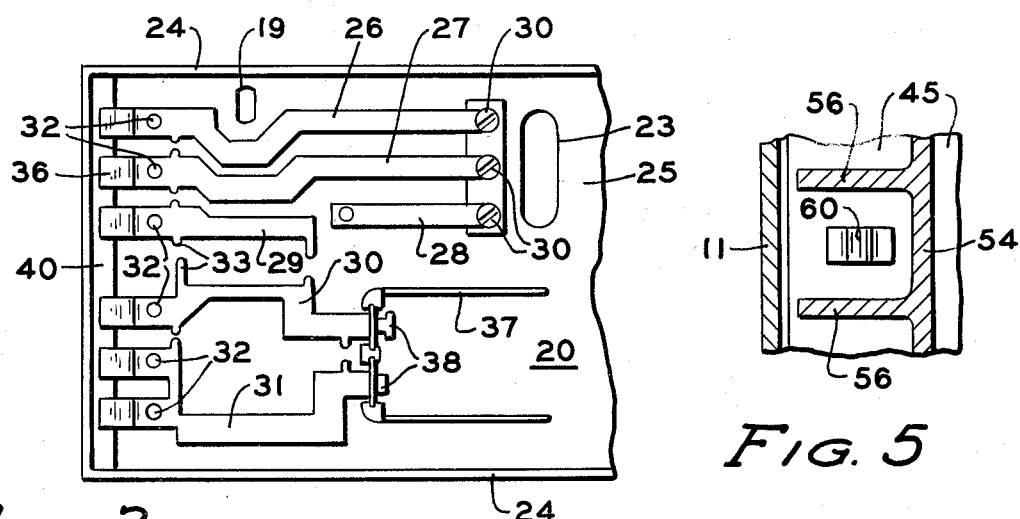
FIG. 3
FIG. 5
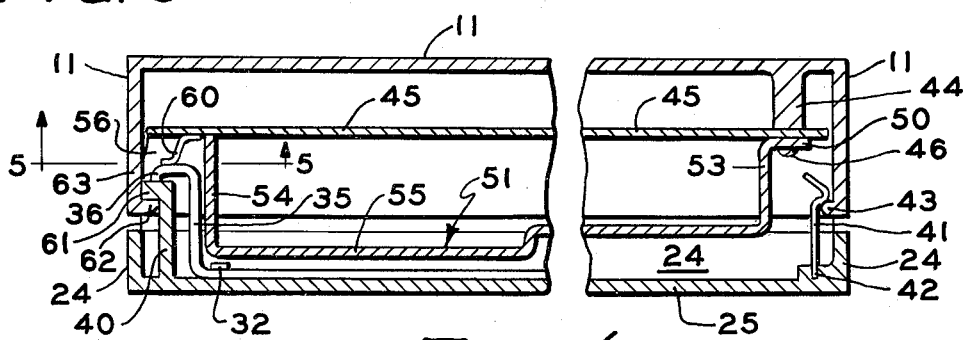
FIG. 4

ELECTRONIC THERMOSTAT WITH PROTECTED CIRCUITRY

BACKGROUND AND SUMMARY OF THE INVENTION

In recent years electronic thermostats have been introduced in the marketplace in increasing numbers. The early electronic thermostats utilized discrete components in their circuitry, and these components are relatively rugged by comparison to the microelectronic types of devices and integrated circuit chips currently in use. The discrete component versions were generally rugged enough to avoid mechanical damage, as well as being relatively immune to damage from static electric discharges that occur when the device is improperly handled.

The typical electronic thermostat is installed in a home or other area that is carpeted and the generation of static electricity by an individual handling the thermostat has become a severe problem in electronic thermostats that use integrated circuits and similar microelectronics in their circuitry. While electronic thermostats typically are made rugged enough so that mechanical damage is reduced to an acceptable level, the static electric discharges that occur when a person walks across a rug and then handles the thermostat has caused significant damage. Electronic thermostats are normally packed with instructions to protect the unit from static discharges, but these instructions many times are ignored by the installers. In many cases the final owner of a residence that includes an electronic thermostat is not aware of the problems of static discharge in the unit and if the unit is handled without proper care it can be damaged and made unusable.

The present invention recognizes the problems involved and provides a design for an electronic thermostat that mounts the printed circuit board that the electronics are attached to behind a static shield. The static shield is mounted in the thermostat cover with only spring contacts available for interconnection outside of that cover. The spring contacts are recessed in openings that are protected by barriers so that the contact surfaces cannot inadvertently be touched when the cover for the thermostat is handled. The base of the thermostat contains the necessary wiring connections for the thermostat to the external controls, as well as, projecting contacts that mate with the flexible contact surfaces to interconnect to the thermostat circuit in the cover when it is mounted on the base. This mounting is simplified by providing the base means and the cover means each with integral projections that allow the cover to be hinged onto the base and held in place by frictional snaps or detents. This provides for both the electrical connection to the printed circuit board and the retention of the cover on the base. Also, the mounting screws which hold the base in place are thus covered and no screw heads are shown external to the electronic thermostat thereby enhancing its design.

DRAWINGS OF THE PREFERRED EMBODIMENT

FIG. 1 is a front view of a thermostat;
FIG. 2 is a side view of the thermostat of FIG. 1;
FIG. 3 is a partial view of a mounting base for the thermostat;
FIG. 4 is a cross section of the thermostat taken along line 4—4 of FIG. 1, and;
FIG. 5 is a partial cross section taken along line 5—5 of FIG. 4.

DESCRIPTION OF THE PREFERRED EMBODIMENT

In FIG. 1 a thermostat 10 is generally disclosed of a rectangular form having a cover means 11. The cover means 11 has thereon a temperature scale indicated at 12. A knob 13 with a pointer 14 is used to select a temperature. The knob 13 is connected to an internal component such as a potentiometer to set the electronic thermostat 10 to the selected temperature. The cover means 11 has an opening 15 through which a liquid crystal display provides an indication of temperature as simulated at 16. The opening 15 and the liquid crystal display can be used to display other pertinent information such as time, if the electronic thermostat is a time programmable or time related control device. A group of three buttons each indicated at 17 protrude through the cover means 11 and are used for controlling the functions of the electronic thermostat 10. The types of functions and the operation of the buttons 17 are not material to the present invention, but have been disclosed merely to provide an overall view of the type of electronic thermostat 10 to which the present invention is directed.

In FIG. 2 an elevation of the thermostat 10 of FIG. 1 is disclosed. The cover means is again disclosed at 11 having the potentiometer knob 13 and the buttons 17, all of which have been shown as a matter of reference. Also, included as part of electronic thermostat 10 is a base means disclosed at 20 that is separated by members 21 from cover means 11 to leave an air space 22 between the base means 20 and the cover means 11. The air space 22 is provided to allow circulation of room air through the thermostat 10 to cause the thermostat 10 to respond properly to the room temperature. It will be understood that the cover means 11 and the mounting base means 20 are two separate elements which, when they are mounted together, form the electronic thermostat 10. This will be brought out in connection with the description of the electronic thermostat 10 in connection with FIGS. 3 and 4.

In FIG. 3 the mounting base means 20 is seen as it would be viewed when the base means 20 is mounted upon a surface, such as a wall of a room. A hole 19 is provided for a mounting screw while a much larger hole 23 is provided to provide access for the wires necessary to connect the electronic thermostat 10 to equipment that it is designed to control. The mounting base 20 has a rimlike edge 24 that encircles the entire periphery of the mounting base means 20 and is formed integral with a flat insulating member 25 through which the holes 19 and 23 are provided.

Attached to the surface 25 are a plurality of gridlike conductors 26, 27, 28, 29, 30, and 31. The conductors 26, 27, and 28 each are terminated with screws 30 that are used to connect wires which pass through the hole 23 to the screws 30 thereby providing a connection means for three wires (this is by way of example only) to the mounting base means 20. Each of the gridlike conductors 26 through 31 are attached to the member 25 by rivetlike fasteners which have been indicated at 32. The manner of forming the conductors 26 through 31 and attaching them to the member 25 is not material to the present invention. The present disclosure shows these conductors as formed of stamped grid elements that have been put into place and attached to the member 25 prior to being separated at points 33. Each of the conductors 26 through 31 has an upstanding portion, one of which can be seen in FIG. 4 at 35. The upstanding portion 35 has been terminated by a bent over portion 36 to form part of a connection means including an electric circuit contact member, of which 36 is an example. The electric contact member 36 is disclosed in FIG. 3 as part of the conductor 27 and is typical of the structure of all six of the connection means disclosed in the device.

The mounting base means 20 has an upstanding wall 37 that supports a pair of terminals 38 that are designed to be connected to a conventional nine-volt battery that is used as a battery powered backup to the electronic thermostat 10 in case of a power failure. The mounting base means 20 further has an upstanding member as disclosed at 40 in FIG. 4, and which can be seen in FIG. 3 as along the left edge of the electric contact members, such as 36. The upstanding member 40 forms part of a hinge means that will be described after the balance of the structure has been disclosed. At a side of the mounting base means 20 opposite from the upstanding member 40 is a metallic, springlike member 41 that is mounted at 42 into the member 25 and acts as a spring loaded detenting means to hold the cover 11 to the mounting base means 20 by passing over a ridge 43 that is formed in the bottom of the cover 11, as can be seen in the right side of FIG. 4.

In FIG. 4 a more detailed disclosure of the cross section as taken along lines 4—4 of FIG. 1 of the entire electronic thermostat 10 can be seen. The cover 11 is a boxlike insulating container that has a group of projections 44 (only one of which has been shown) to space a circuit board means 45 from the cover 11. The circuit board means 45 mounts the majority of the electronic components and a number of other electromechanical components for the electronic thermostat 10, and no effort has been made to show these components as they are not material to the present invention. It must be understood that the circuit board means 45 is of conventional design mounting electronic circuitry in a conventional manner. The circuit board means 45 is held in place by a pin or screw 46 that passes through a flange 50 of an insulating enclosure means generally disclosed at 51. The insulating enclosure means 51 is a generally boxlike insulating container that has the flange 50 and the edges 53 and 54 along with a bottom 55 to substantially enclose the bottom side of the circuit board 45 to protect the circuit board from damage by accidental contact with the circuit board or any of the components mounted thereon. There are a number of projections 44 and mounting means 46 to hold the circuit board means 45 tightly in place between the cover means 11 and the insulating enclosure means 51.

The insulating enclosure means 51 is completed by a plurality of barriers 56 (only one of which has been shown in elevation in FIG. 4). In FIG. 5 a section taken along line 5—5 in FIG. 4 shows the barriers in more detail. Also shown is the underside of the circuit board means 45. There is an insulating barrier 56 between each of the electric contact members exemplified by contact member 36. Each of the contact members (as exemplified by 36) would be separated by a barrier 56 from its neighbor contact member thereby providing a recess which partially encloses the contact means for the circuit board means 45. This leaves only sufficient space between the edge 54 of the insulating enclosure means 51 and the cover means 11 of the thermostat 10 for the introduction of the electric contact members 36 to reach the contact means for the circuit board 45. This again can best be seen in FIG. 5. The contact means for the circuit board 45 is completed as disclosed at 60 by flexible contact means that are attached to the circuit board means 45 at appropriate locations for the electric circuitry and which in turn make a frictional or pressure contact with the electrical contact members 36 when the mounting base means 20 is attached to the cover means 11.

To this point the cover means 11 and the mounting base means 20 have been referred to as being attached to form the thermostat 10 as if the two had been brought into engagement without the hinge action, which will be described to complete the disclosure. The upstanding member 40 of the mounting base means 20 has a projection 61 that interlocks with a projection 62 that is molded into the edge 63 of the cover means 11. The projections 61 and 62 interlock to form a hinge so that the cover means 11 can be pivoted into engagement with the mounting base means 20 allowing for a frictional and compression contact between the electrical contact members 36 and the flexible contact means 60 that connects to the circuit board means 45. When this action takes place the projection 43 causes the springlike member 41 to be deflected and detents to hold the cover means 11 onto the mounting base means 20 to form the complete electronic thermostat.

In the electronic thermostat of FIGS. 1 through 4, the cover means 11 is attached to the mounting base 20 by hooking the projection 62 over the projection 61 and swinging the cover means 11 down to allow the detent mechanism at the right hand side to lock the cover means 11 onto the base means 20. This causes a compression between the electric contact members 36 and the flexible contact means 60. It will be noted that the electric contact members 36 project up into recesses formed by the barrier 56, the wall 54 of the insulated enclosure means 51 and the outer wall of the cover means 11 as best seen in FIG. 5. The opening through which the electric contact members 36 pass are sufficiently small as to preclude accidental entry of a finger or similar object to thereby protect the electronic circuitry mounted on the circuit board means 45. As was pointed out earlier, the hinge action disclosed could be replaced by a plurality of latching means similar to that disclosed on the right hand side of FIG. 4 thereby allowing for a straight line mounting of the cover means 11 on the mounting base means 20. The present disclosure of a hinged arrangement provides a more rigid and more reliable mounting action between the base means 20 and the cover means 11. It will also be understood that since all of the screw holes for mounting the base means 20 are through the member 25, the mounting screws can be conveniently hidden thereby leaving the design of the thermostat free of any such eyesores.

The present invention has been disclosed in one specific embodiment, while an alternative embodiment was mentioned. It is obvious that the concept of the present invention could be incorporated in other types of physical arrangements for electronic thermostats and therefore the applicant wishes to be limited in the scope of his invention solely by the scope of the appended claims.

The embodiments of the invention in which an exclusive property or right is claimed are defined as follows:

1. An electronic thermostat having circuit components that are subject to electrical and mechanical damage, including: mounting base means and cover means forming said electronic thermostat when said base means and said cover means are mounted together; circuit board means including electronic circuit components that are susceptible of electrical and mechanical damage; said circuit board means further having contact means in the form of a plurality of separate individual contact members mounted upon said board means and connected to said electronic circuit components; said circuit board means mounted within said cover means; insulating enclosure means mounted within said cover means to partially enclose said circuit board means to protect said circuit board means from damage by accidental contact with said circuit board means; said insulating enclosure means including barrier means which form separate individual plural contact openings of limited size to provide access to said individual contact members through said contact openings; said base means adapted to be mounted upon a surface with said base means including connection means; and said base connection means including separate plural electric base contact members that project from said base means through said openings to engage said circuit board contact members to complete electric connections from said base means to said circuit board means to complete the mounting of said electronic thermostat.

2. An electronic thermostat as described in claim 1 wherein said circuit board contact means includes flexible contact members which frictionally engage said electric contact members projecting from said base means.

3. An electronic thermostat as described in claim 2 wherein each of said electric contact members includes a base portion rigidly attached to said base means and an upstanding portion projecting from said base means and engaging one of said contact members at said circuit board means.

4. An electronic thermostat as described in claim 1 wherein said electronic thermostat further includes hinge means for joining said mounting base means and said cover means; said hinge means aiding the alignment of said electric contact members and said contact means to allow said contact members and said contact means to be compressed to complete an electric connection from said base means to said circuit board means; and detent means opposite from said hinge means to retain said mounting base means and said cover means mounted together.

5. An electronic thermostat as described in claim 4 wherein said hinge means is formed as a pair of interlocking members integral with said mounting base means and said cover means.

6. An electronic thermostat as described in claim 5 wherein said hinge means is formed adjacent said contact means which are mounted upon said circuit board means and said electric contact members.

7. An electronic thermostat as described in claim 6 wherein said circuit board contact means includes flexible contact members which frictionally engage said electric contact members projecting from said base means.

8. An electronic thermostat as described in claim 7 wherein each of said electric contact members includes a base portion rigidly attached to said base means and an upstanding portion projecting from said base means and frictionally engaging one of said flexible contact members at said circuit board means.

* * * * *